(12) United States Patent
Katoch et al.

(10) Patent No.: US 8,295,112 B2
(45) Date of Patent: Oct. 23, 2012

(54) SENSE AMPLIFIERS AND EXEMPLARY APPLICATIONS

(75) Inventors: Atul Katoch, Ontario (CA); Mayank Tayal, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 211 days.

(21) Appl. No.: 12/731,625

(22) Filed: Mar. 25, 2010

(65) Prior Publication Data

US 2010/0246303 A1    Sep. 30, 2010

Related U.S. Application Data

(60) Provisional application No. 61/165,236, filed on Mar. 31, 2009.

(51) Int. Cl.
    *G11C 7/02* (2006.01)
(52) U.S. Cl. .................. 365/207; 365/205; 365/230.08
(58) Field of Classification Search .................. 365/207, 365/205, 230.08
    See application file for complete search history.

(56) References Cited

U.S. PATENT DOCUMENTS

| 5,729,492 | A | 3/1998 | Campardo |
| 6,341,088 | B2 * | 1/2002 | Sakamoto et al. ............ 365/190 |
| 7,436,722 | B2 * | 10/2008 | Mizuno et al. ................ 365/203 |

* cited by examiner

*Primary Examiner* — Son Dinh
*Assistant Examiner* — Nam Nguyen
(74) *Attorney, Agent, or Firm* — Lowe Hauptman Ham & Berner, LLP

(57) ABSTRACT

Embodiments of the invention are related to sense amplifiers. In an embodiment involving a sense amplifier used with a memory cell, signals BL, ZBL, SN and SP are pre-charged and equalized to a voltage reference, e.g., Vref, using an equalizing signal. A compensation signal, e.g., SAC, is applied to compensate for the mismatch between transistors in the sense amplifier. The word line WL is activated to connect the memory cell to a bit line, e.g., bit line ZBL. Because the memory cell shares the charge with the connected bit line ZBL, it causes a differential signal to be developed between bit lines BL and ZBL. When enough split between bit lines BL and ZBL is developed, signals SP and SAE are raised to VDD (while signal SN has been lowered to VSS) to turn on the sense amplifier and allow it to function as desire. Other embodiments and exemplary applications are also disclosed.

11 Claims, 5 Drawing Sheets

SENSE AMPLIFIERS AND EXEMPLARY APPLICATIONS

CROSS-REFERENCE TO RELATED APPLICATIONS

The present application claims priority of U.S. Provisional Patent Application Ser. No. 61/165,236, filed on Mar. 31, 2009, which is incorporated herein by reference in its entirety.

TECHNICAL FIELD

The present disclosure is related to sense amplifiers. In various embodiments, a sense amplifier is able to electrically compensate for semiconductor process mismatches and thus sense smaller bit line splits and allowing a larger number of memory cells to be connected to it.

BACKGROUND

Due to process mismatches conventional sense amplifiers require large bit line split to reliably sense data. A bit line split is a voltage difference between two bit lines, e.g., a bit line BL and a bit line ZBL. In various approaches, to achieve larger bit line splits, shorter bit lines with less memory cells are used, which limits the number of cells that can be connected to a sense amplifier and results in lower memory density.

BRIEF DESCRIPTION OF THE DRAWINGS

The details of one or more embodiments are set forth in the accompanying drawings and the description below. Other features and advantages will be apparent from the description, drawings, and claims.

Like reference symbols in the various drawings indicate like elements.

DETAILED DESCRIPTION

Figure 1:
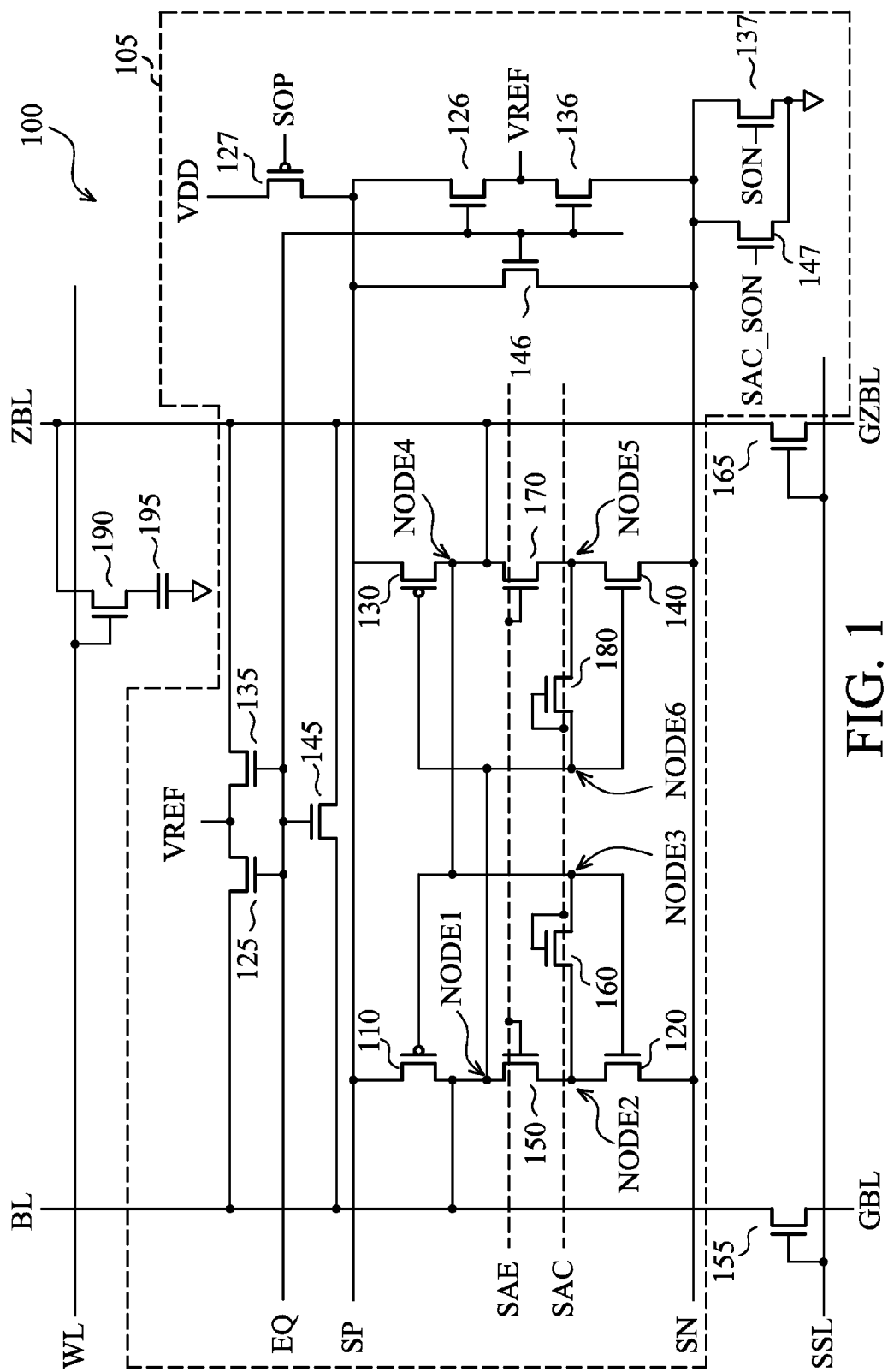
FIG. 1 shows a circuit using a sense amplifier in accordance with an embodiment of the invention.

Embodiments, or examples, of the invention illustrated in the drawings are now being described using specific languages. It will nevertheless be understood that no limitation of the scope of the invention is thereby intended. Any alterations and modifications in the described embodiments, and any further applications of principles of the embodiments described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

THE SENSE AMPLIFIER EMBODIMENT IN OPERATION WITH A MEMORY CELL

FIG. 1 shows a circuit 100 illustrating a sense amplifier 105 being used in conjunction with a memory cell 195 in accordance with an embodiment of the invention. Transistor 190 allows access between sense amplifier 105 and memory cell 195.

Sense amplifier 105 includes transistors 110, 120, 130, 140, 150, 160, 170, 180, 125, 135, 145, 126, 136, 146, 127, 137, and 147. Transistors 110, 120, 130, and 140 form the sensing pair for sense amplifier 105. Transistors 150, 160, 170, and 180 are configured to compensate for mismatch, e.g., process mismatch, between transistors in sense amplifier 105, including mismatch between transistors 120 and 140. In various embodiments, these transistors 150, 160, 170, and 180 act as switches e.g., providing open or short circuits depending on the need of the applications as appropriate. Transistors 125, 135, 145, 126, 136, and 146 are used in pre-charge and equalization of bit lines BL and ZBL and signals SP and SN. Transistors 127, 137, and 147 control the transitions of signals SP and SN (e.g., allowing the signal to be pulled weakly or strongly). Transistors 155 and 165 enable data transfer between bit lines BL and ZBL, and global bit lines GBL and GZBL, respectively.

Word line WL controls transistor 190 to allow access to memory cell 195. When word line WL is de-activated, e.g., a low voltage level, it turns off transistor 190 and thus disconnects memory cell 195 from the bit line being connected to memory cell 195. When word line WL is activated, e.g., a high voltage level, it turns on transistor 190 and thus connects memory cell 195 to a bit line, which, depending on application, could be bit line BL or ZBL. FIG. 1 shows bit line ZBL is connected to memory cell 195 (via transistor 190) for illustration purposes only. Depending on implementations in a memory array some memory cells may be connected to bit line BL while some other cells may be connected to bit line ZBL.

In an embodiment, memory cell 195 is a capacitor storing charges, and "low" data associated with memory cell 195 indicates a voltage lower than Vref while "high" data indicates a voltage higher than Vref. When memory cell 195 is connected to a bit line, e.g., ZBL as shown in FIG. 1, memory cell 195 shares the same charge with this bit line ZBL. Depending on the charge indicating the logic level of memory cell 195, bit line ZBL is pulled one way or another. For example, if memory cell 195 stores a low, then bit line ZBL is pulled towards ground. Conversely, if memory cell 195 stores a high, then bit line ZBL is pulled towards VDD. After sharing of charge there is development of potential difference between bit line BL and bit line ZBL, which is referred to as bit line split. The amplitude of the bit line split depends on the charge transfer ratio or capacitance of memory cell 195 and bit line ZBL. If bit line ZBL is longer and connected to a lot of memory cells, the charge ratio becomes smaller and the bit line split is reduced. Conversely, if bit line ZBL is shorter and connected to less number of memory cells, the charge ratio becomes higher and the bit line split is increased.

Bit lines BL and ZBL serve as both input and output (IO) for sense amplifier 105. Generally, except when being pulled to Vref to be pre-charged and equalized, bit lines BL and ZBL are of the opposite level of one another. For example, if bit line BL is low then bit line ZBL is high, and if bit line BL is high then bit line ZBL is low. Further, the bit line on which the data is written or sensed is referenced to the other bit line. In a write cycle, applying a logic level to a bit line, e.g., bit line ZBL, and the opposite level to the other bit line, e.g., bit line BL, enables writing the logic level at bit line ZBL to memory cell 195. For example, applying a high to bit line ZBL and a low to bit line BL, enables memory cell 195 to be written with a high. Conversely, applying a low to bit line ZBL and a high to bit line BL, enables memory cell 195 to be written with a low. Further, in a read cycle, sensing (or reading) the logic level at a bit line, e.g., bit line ZBL, in reference to the other bit line, e.g., bit line BL, reveals the data stored in memory cell 195. For example, if memory cell is storing a high, then sensing a bit line, e.g., bit line ZBL, reveals a high. Conversely, if memory cell is storing a low then sensing a bit line, e.g., bit line, ZBL, reveals a low. When there is enough split (e.g., voltage difference) between bit lines BL and ZBL, then there is a difference in VGS of transistors 110 and 120 as compared to VGS of transistors 130 and 140, sense amplifier 105 senses or amplifies this voltage difference. VGS is the voltage from a gate to a source of a transistor.

Generally, because of the mismatch, e.g., process mismatch, transistors 120 and 140 have different characteristic, such as differences in threshold voltages, drain-to source currents (e.g., $I_{DS}$), current driving capabilities, etc. Current driving capability of a transistor (e.g., transistor 120, 140, etc.) depends on $I_{DS}$ of that transistor when the transistor is on. If this current $I_{DS}$ of a transistor is large, then the transistor is said to have strong current driving capability, and, conversely, if this current $I_{DS}$ is small, then the transistor is said to have weak current driving capability. Further, bit lines BL and ZBL need to be widely split, i.e., experience a large voltage difference before sense amplifier 105 can sense the data reliably. Embodiments of the invention compensate for that mismatch such that bit lines BL and ZBL are eventually and quickly at levels such that the characteristic of transistors 120 and 140 are closer to that of one another, which reduces the needed split between bit lines BL and ZBL, and, as a result, enables sense amplifier 105 to sense smaller split between bit lines BL and ZBL. In an embodiment, the compensation period takes about 1 ns, and, without the compensation mechanism, the split between bit lines BL and ZBL is about 70 mV. That is, if bit line ZBL is to be pulled up to a high to sense the data, then it would be pulled up more than 70 mV above bit line BL to sense correctly. With the compensation mechanism in accordance with embodiments of the invention, amplifier 105 can reliably sense the data when the split between bit lines BL and ZBL is much less than 70 mV in which the split selection is a design choice. For example, a system designer, based on applications, may determine any split, e.g., 10 mV, 20 mV, 30 mV before allowing sense amplifier 105 to sense the desire data.

Vref serves as a known reference point to which signals BL, ZBL, SP, and SN can be pre-charged and equalized before compensation. When signal EQ is activated, e.g., high, it turns on transistors 125, 135, and 145, allowing Vref to be forced onto signals BL, ZBL. Additionally, the activated signal EQ also turns on transistor 126, 136, and 146, allowing Vref to be forced onto signals SP and SN.

Signal EQ equalizes signals BL, ZBL, SP, and SN. When signal EQ is activated, e.g., high, it turns on transistor 145 and 146 allowing signals BL, ZBL, SP, and SN to be at the same level of Vref. In various embodiments, even after attempting to equalize bit lines BL and ZBL, because of the process mismatch, transistors 120 and 140 have different VGS-VT, (thereby different current driving capabilities) where VT is the threshold voltage of a transistor. Due to process mismatch, VT of transistor 120 is not the same as that of transistor 140. As a result, even though VGS is the same for both transistors 120 and 140, VGS-VT is different. Embodiments of the invention improve the effect of the process mismatch, i.e., shorten the time period and reduce the needed bit line split between bit lines BL and ZBL to be acceptable because VGS-VT of transistors 120 and 140 are substantially and/or approximately equal.

Signals SP and SN are used to operate sense amplifier 105, e.g., turning it on or off. Signal SP is the switch power while signal SN serves as ground. In general, when signals SP and SN are at a same level, e.g., pulled to Vref, amplifier 105 is off, and when signal SP is high (e.g., at VDD) and SN is low (e.g., at ground), sense amplifier 105 is on. For example, in an application, and at a pre-charge and equalization stage, sense amplifier 105 is off when signals SP and SN are pulled to Vref. When signal SP is raised from Vref to VDD and signal SN is pulled from Vref to VSS, sense amplifier 105 receives the desired electrical power and, consequently, is turned on. A weak transition of signal SN indicates that it being pulled to VSS slowly while a strong transition indicates that it being pulled to VSS quickly. Similarly, a weak transition of signal SP indicates that it being pulled to VDD (e.g., from Vref) slowly while a strong transition of signal SP indicates that it being pulled to VDD quickly.

Signal SAE controls transistors 150 and 170. When signal SAE is de-activated, e.g., at a low voltage level, it turns off transistors 150 and 170, which disconnects the series connections between transistors 110 and 120, and between transistors 130 and 140. That is, it provides an open circuit between Node 1 and Node 2 and between Node 4 and Node 5. When signal SAE is activated, e.g., at a high voltage level, it turns on transistors 150 and 170, which enables the series connection between transistors 110 and 120 and between transistors 130 and 140. That is, it provides a short circuit between Node 1 and Node 2 and between Node 4 and Node 5. Because transistors 150 and 170 in various embodiments act to open and short applicable circuits, they may be referred to as a switch. In accordance with embodiments of the invention, a switch may be used in place of a transistor 150 and/or 170.

Signal SAC provides compensation for the mismatch including process mismatch. When signal SAC is de-activated, e.g., at a low voltage level, it turns off transistors 160 and 180, providing an open circuit between Node 2 and Node 3 and between Node 5 and Node 6. As a result, there is no compensation. When signal SAC is activated, e.g., at a high voltage level, it turns on transistors 160 and 180, providing a short circuit between Node 2 and Node 3 and between Node 5 and Node 6, and therefore enabling compensation. During compensation signal SAE is off to turn off transistors 150 and 170. Further, signal SP is at Vref and signal SN is transitioning from Vref to ground. In various embodiments, signal SN is controlled such that it has a weak transition during this compensation period or bit lines BL and ZBL would be pulled down very quickly leading to a huge reduction in the pre-charge level. In various embodiments, process compensation provided by signal SAC puts bit lines BL and ZBL at voltages different from each other such that VGS-VT for transistor 120 and 140 are approximately equal. Because transistors 160 and 180 in various embodiments act to open and short applicable circuits, they may be referred to as a switch. In accordance with embodiments of the invention, a switch may be used in place of a transistor 160 and/or 180.

During compensation (e.g., signal SAC is activated), signal SAC_S0N is activated (e.g., at a high voltage level) to turn on transistor 147, which allows a weak transition of signal SN to VSS (e.g., ground). As a result, both VGS and VDS of transistors 120 and 140 remain at a small level and therefore can prevent bit lines BL and ZBL from being pulled down quickly that could lead to a huge reduction in the pre-charge level. When the huge reduction in the pre-charge level occurs, sensing a low on memory cell 195 would result in a very small charge sharing between the memory cell 195 and a bit line (e.g., BL or ZBL), which would cause a small split between the bit lines BL and ZBL after compensation.

Signals SON and SOP are complementary and control transistors 137 and 147 respectively. When signal SON is activated (e.g., at a high voltage level), it turns on transistor 137 and when it is de-activated (e.g., at a low voltage level), it turns off transistor 137. Similarly, when signal SOP is activated (e.g., at a low voltage level) it turns on transistor 127, and when it is de-activated (e.g., at a high voltage level), it turns off transistor 137. Generally, transistors 137 and 127 are on when sense amplifier 100 is desired to be turned on. As transistors 137 and 127 are on, they allow a strong transition of signals SN and SP respectively. During pre-charge signals SON and SOP are at VSS and VDD to turn off transistors 137 and 127 respectively.

Global bit lines GBL and GZBL enable data transferring between a local memory cell, e.g., memory cell 195, and other components, e.g., another level of sense amplifiers (not shown). Signal SSL and transistors 155 and 165 enable such transfer. For example, when signal SSL is selected, e.g., high, it turns on transistors 155 and 165, which allows bit lines BL and ZBL to be connected to global bit lines GBL and GZBL, respectively, and therefore enable data transfer between bit lines BL and GBL and bit lines ZBL and GZBL. When signal SSL is de-activated, e.g., at a low voltage level, it turns off transistors 155 and 165 and thus disconnects bit lines BL and ZBL form bit lines GBL and GZBL, respectively.

Embodiments of the invention can control the timing of various signals, e.g., to equalize, to compensate, to connect memory cell 195 to sense amplifier 105, to turn on/off amplifier 105, etc. For example, embodiments can control the timing to activate a signal and to maintain such timing for a period of time (e.g., maintain the pulse width) for signals EQ, SAE, SAC, WL, etc. In an embodiment, signals SN and VSS are at 0V; signals SP and VDD are at 1.1V and 1.5V, respectively while signal Vref is at VDD/2.

Figure 2:
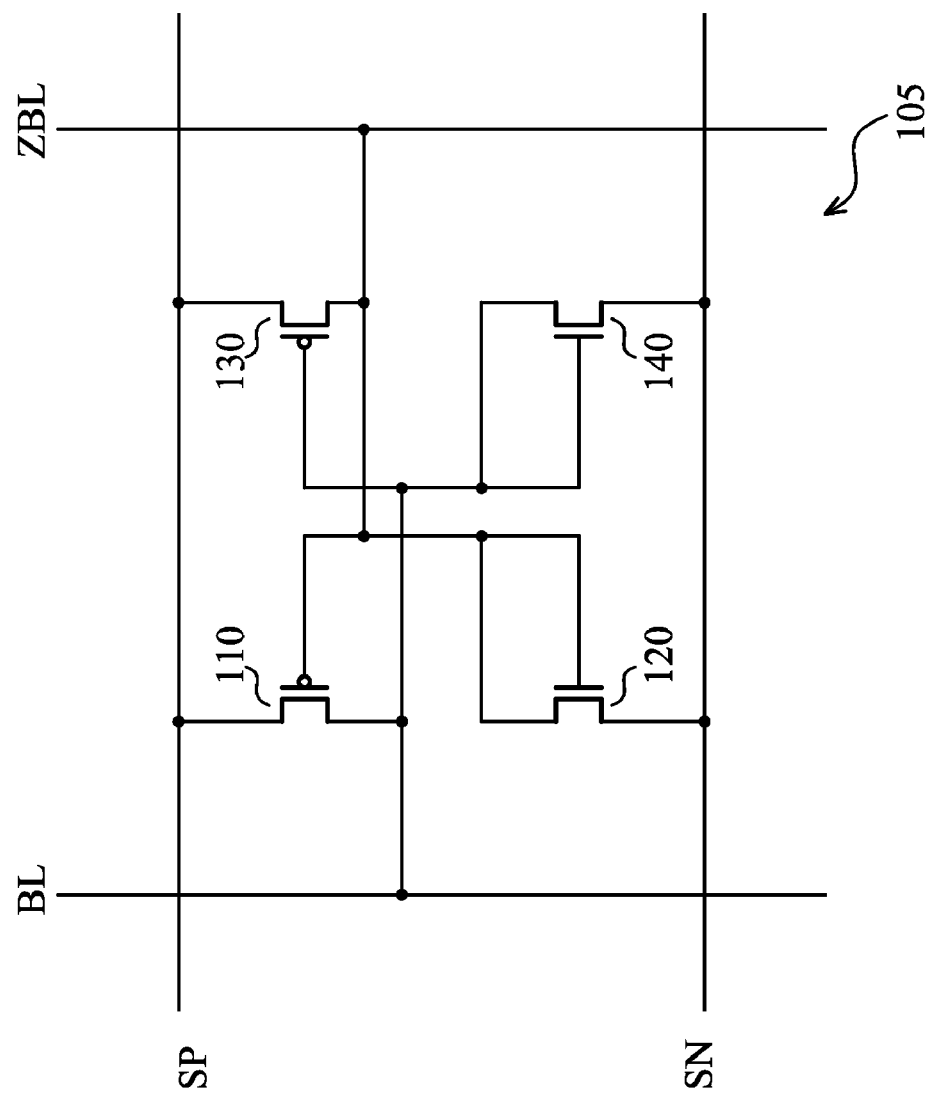
FIG. 2 shows the sense amplifier of FIG. 1 wherein various transistors are shown electrically connected during compensation, in accordance with an embodiment.

FIG. 2 shows sense amplifier 105 in which transistors 120, 130, 140, 150, 160, 170, and 180 are shown electrically connected during compensation, in accordance with an embodiment. As discussed above, during compensation transistors 150 and 170 are off, and as a result, they act as open circuits, and are not shown in FIG. 2. Similarly, transistors 160 and 180 are on, act as short circuits, and are also not shown in FIG. 2. For simplicity, references to Node 1, Node 2, Node 3, Node 4, Node 5, and Node 6, signals EQ, Vref, SAE SAC, and transistors 125, 135, 145, 126, 136, 146, 127, 137, and 147 are not shown either.

Figure 3:
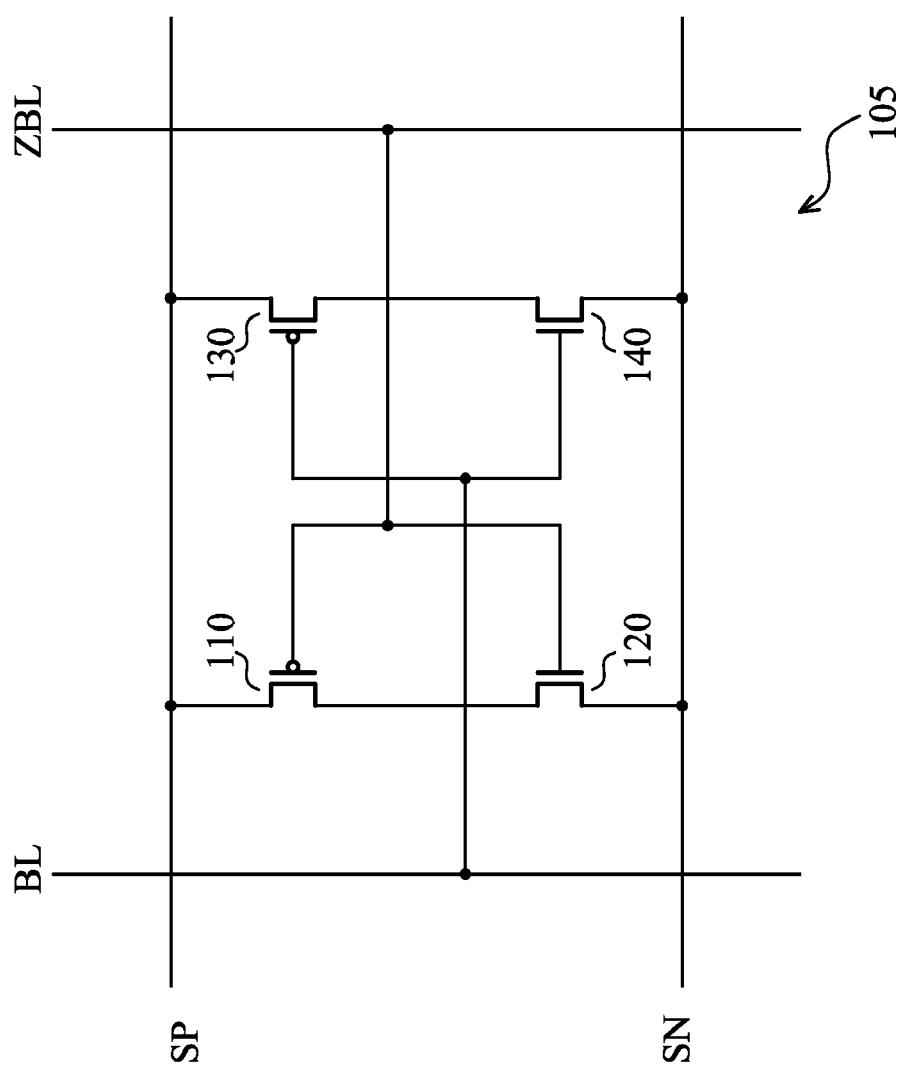
FIG. 3 shows the sense amplifier of FIG. 1 wherein various transistors are shown electrically connected during non-compensation, in accordance with an embodiment.

FIG. 3 shows sense amplifier 105 in which transistors 120, 130, 140, 150, 160, 170, and 180 are shown electrically connected during non-compensation. During this time, transistors 150 and 170 are on, act as short circuits, and are not shown in FIG. 3. Further, transistors 160 and 180 are off, act as open circuit, and are not shown in FIG. 3. For simplicity, references to Node 1, Node 2, Node 3, Node 4, Node 5, and Node 6, signals EQ, Vref, SAE, SAC, and transistors 125, 135, 145, 126, 136, 146, 127, 137, and 147 are not shown either.

METHOD EMBODIMENT

Figure 4:
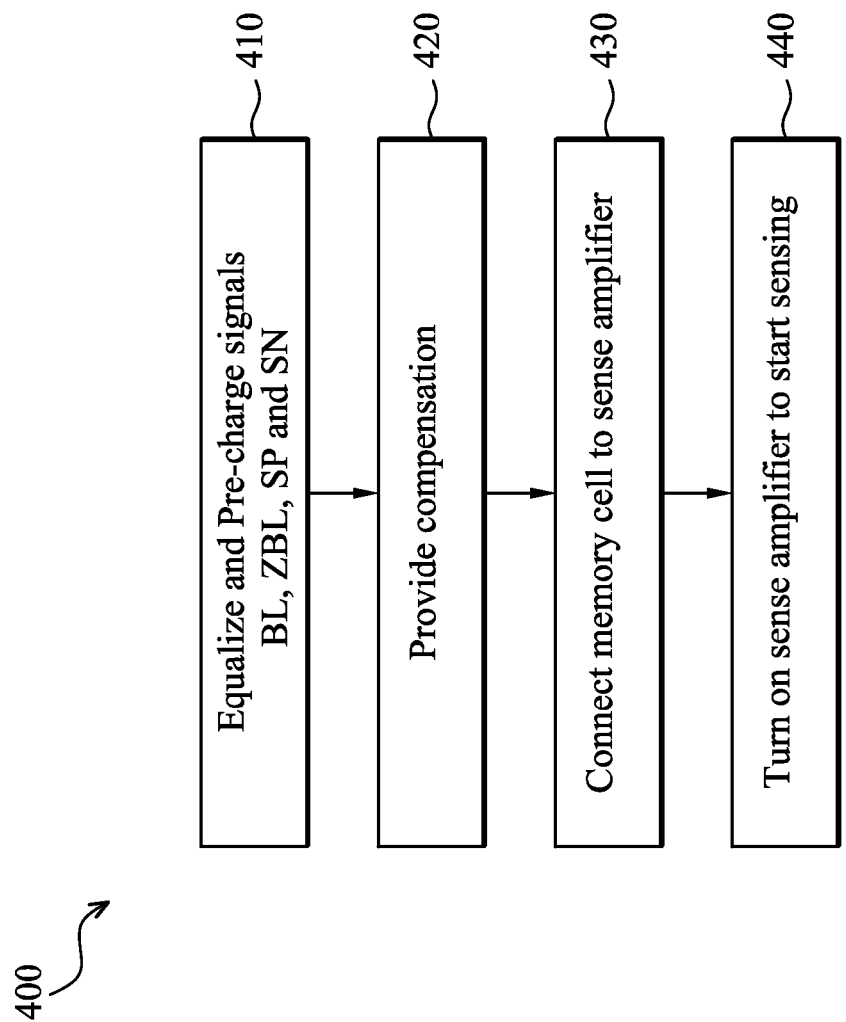
FIG. 4 shows an illustrative method embodiment.

FIG. 4 shows a method embodiment 400 illustrating amplifier 105 in operation with memory cell 195.

In block 410, signals BL, ZBL, SP, and SN are pre-charged and equalized.

In block 420, compensation is asserted by reconfiguring transistors in sense amplifier 105, e.g., turning on transistors 160 and 180 and turning off transistors 150 and 170.

In block 430, memory cell 195 is connected to sense amplifier 105.

In block 440, sense amplifier 105 is turned on starting to sense the data in memory cell 195.

EXEMPLARY SIGNALS

Figure 5:
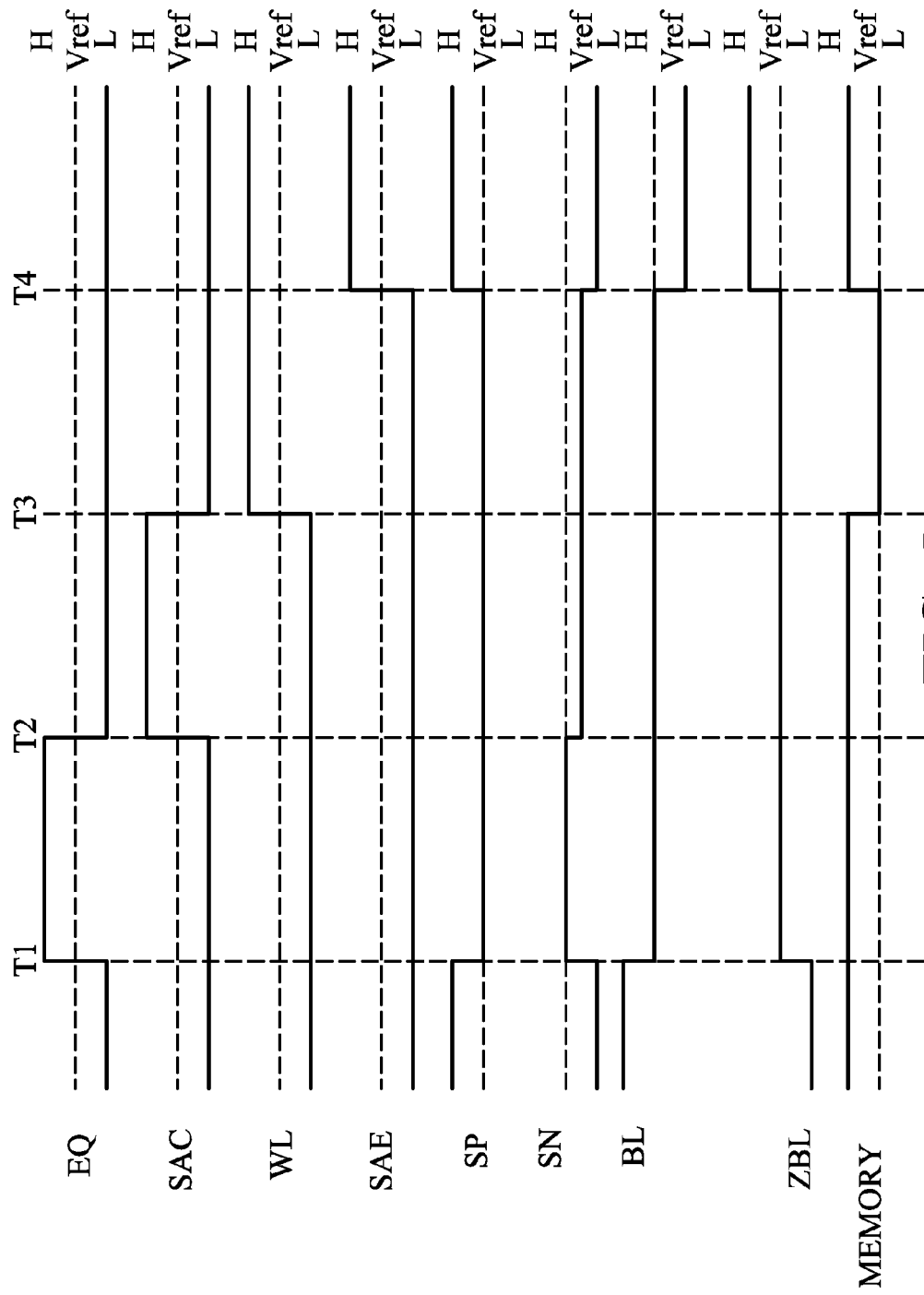
FIG. 5 shows signals corresponding to the method embodiment of FIG. 4.

FIG. 5 shows signals corresponding to the blocks in FIG. 4, in accordance with an embodiment. Corresponding to each signal, the levels H, Vref, and L are shown to indicate whether the signal is at a high voltage level, at Vref, or at a low voltage level, respectively. Time periods T1, T2, T3, and T4 correspond to block 410, 420, 430 and 440 in FIG. 4, respectively. For illustration purposes, signals EQ, SAC, WL, SAE, SP, SN, BL, and ZBL are initially (e.g., prior to time T1) low, low, low, low, high, low, high, and low, respectively. Further, memory cell 195 is storing a high. In reality, when a signal is activated/de-activated, there are some delays before other signals are affected by such activation/de-activation, but for illustration purposes, such delays are not shown in FIG. 4. Further, FIG. 5 shows digital signals while in application various signals are analog.

At time T1, signal EQ is activated, e.g., turned high, and signals BL, ZBL, SP, and SN are forced to Vref. That is, signals BL, ZBL, SP, and SN are pre-charged and equalized to the same potential of Vref. Between time T1 and T2, because signals SP and SN are at the same level of Vref, sense amplifier 105 is off. Signals BL and ZBL are pre-charged and equalized to Vref so that they are at a controllable known state. Further, even after attempting to equalize bit lines BL and ZBL, because of the process mismatch, transistors 120 and 140 have different VGS-VT, (thereby have different current driving capabilities,). Due to process mismatch VT of transistor 120 is not the same as that of transistor 140, and, as a result, even though VGS is the same for both transistors, VGS-VT is different, as explained above.

At time T2, signal EQ is de-activated, e.g., turned low, so that signals BL and ZBL can operate on their own course. Further, signal SAC is activated, e.g., turned high, for compensation to begin. Because signal SAC is activated and signal SAE has been de-activated, sense amplifier 105 is configured as shown in FIG. 2. Further, because transistors 120 and 140 have different characteristic, e.g., different driving capabilities, VGS of transistors 120 and 140 are different, even though they are supposed to be the same. For further illustration purposes, the driving capability of transistor 120 is greater than that of transistor 140. Alternatively speaking, transistor 120 is "stronger" than transistor 140 or the threshold voltage (VT) of transistor 120 is lower than that of transistor 140, resulting in transistor 120 being easier to be turned on than transistor 140. Because transistor 120 is stronger than transistor 140, sense amplifier 105 is imbalanced. Further, also because of the same reason that transistor 120 is stronger than transistor 140, transistor 120 pulls bit line ZBL more than transistor 140 pulling bit line BL, which results in compensation. That is, bit lines BL and ZBL are at voltages different from each other such that VGS-VT for transistor 120 and 140 are substantially and/or approximately equal. Conversely, if transistor 120 is weaker than transistor 140, sense amplifier 105 would also be imbalanced. Further, also because transistor 120 is weaker than transistor 140, transistor 120 pulls bit line ZBL weaker than transistor 140 pulling bit line BL, resulting in compensation. In various embodiments, after compensation, bit lines BL and ZBL are at voltages different from each other such that VGS-VT for transistor 120 and 140 are approximately equal. In a perfect scenario, bit lines BL and ZBL are at the voltage levels causing equal VGS-VT after compensation. Once the split between bit lines BL and ZBL is acceptably small, sense amplifier 105 may be turned on to function as desire. In various embodiments, the residue offset (e.g., difference in characteristic) between transistors 120 and 140 is significantly small at the end of the compensation period (e.g., time T3). In a perfect compensation, the VGS-VT difference between transistors 120 and 140 would be zero, and they are said to have the same characteristic. During compensation, signal SN is pulled weakly to VSS (or ground), which pulls different charges from bit lines BL and ZBL depending on the mismatch of transistors 120 and 140. During times T2 and T3 signal SN is between Vref and ground.

At time T3, once enough compensation is achieved, i.e., VGS-VT difference between transistors 120 and 140 is acceptably small, signal SAC is de-activated, e.g., turned low, and signal WL is activated, e.g., turned high, allowing memory cell 195 to be connected to a bit line. For illustration purposes, bit line ZBL is connected to memory cell 195. As a result, memory cell 195 shares the same charge with bit line ZBL and is pulled to the level of bit line ZBL, which is at Vref. Further, because memory cell 195 is storing a high, bit line ZBL is pulled up attempting to reach this high level subject to the maximum high level of bit line ZBL.

At time T4 signals SAE and SP are activated, e.g., pulled high. Because signal SAE is activated and signal SAC has been de-activated, sense amplifier 105 is configured as shown in FIG. 3. Signal SP is activated to turn on sense amplifier 105. At this time, signal SN is pulled strongly to VSS level (e.g., low). Signal SP being high and signal SN being low provide the full power to sense amplifier 105 and thus turns it on and allow it to function (e.g., sense) as desire. Further bit line BL is pulled lower than Vref toward ground or low while bit line ZBL is pulled higher than Vref toward VDD or high. Additionally, the logic in memory cell 195 follows bit line ZBL toward VDD or high.

In the above description, sense amplifier 105 is illustrated as in operation with memory cell 195, embodiments of the invention are not limited to such application, but are applicable when compensation is desired. For example, sense amplifier 105 may be used as a comparator comparing two signals where (e.g., because of process mismatch) the transistors in the comparator and/or the input signals to that comparator would be benefited from compensation.

A number of embodiments of the invention have been described. It will nevertheless be understood that various variations and/or modifications may be made without departing from the spirit and scope of the invention. For example, the logic level (e.g., low or high) of the various signals EQ, SAC, SAE used in the above description is for illustration purposes only, embodiments of the invention are not limited to a particular level when the signal is activated or deactivated, but, rather, selecting such a level is a matter of design choice and is within the scope of the invention. For example, signals, EQ, SAC, SAE are shown as active high (e.g., being high when activated and low when de-activated), but the reverse (e.g., being low when activated and high when de-activated) is also within the scope of the invention. The various transistors are shown as a particular type (e.g., NMOS and PMOS) are also for illustration purposes, embodiments of the invention are not limited to a particular type, but the particular type selected for a transistor is also a design choice and within the scope of the invention. For example, transistors 120, 140, 150, 160, 170, 180, 125, 135, 145, 126, 136, 146, 155, 165 are shown as N types while transistors 110 and 130 are shown as P type, but the invention is not limited to such choices. For example, when appropriate, as known by a person skilled in the art, NMOS transistors in circuit 100 may be replaced by PMOS transistors and PMOS transistors may be replaced by NMOS transistors. In such situations, the level of signals SP and SN should be changed (e.g. to the opposite level) for the transistors to operate accordingly. Further, a combination of PMOS and NMOS transistors may be used and are within the scope of embodiments of the invention. In various embodiments, each of transistors 150, 160, 170, and 180 acts as a switch. As a result, any switch that can perform the function of the invention as described using the above illustration embodiments are within the scope of the invention. Further, they are shown as NMOS transistors, but one or a combination of them may be replaced by a PMOS transistor, as known by a person skilled in the art. Transistors 127, 137, and 147 are shown as part of sense amplifier 105, but they may be outside of sense amplifier 105 and/or shared with other sense amplifiers to perform their functions.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A circuit comprising:
  a first pair of transistors;
  a second pair of transistors;
  a first IO;
  a second IO;
  a first pair of switches;
  a second pair of switches;
  wherein the first pair of switches and the second pair of switches are configured for the first pair of transistors and the second pair of transistors to change a voltage level at the first IO and at the second IO.

2. The circuit of claim 1 wherein the first pair of switches and the second pair of switches are configured for the first pair of transistors and the second pair of transistors to act as a sense amplifier.

3. The circuit of claim 1 wherein the first pair of switches operates at a first mode different from a second mode of the second pair of switches when the first pair of transistors and the second pair of transistors operate to provide compensation for the second pair of transistors.

4. The circuit of claim 1 wherein changing the voltage level at the first IO and the second IO comprises reducing a characteristic difference between a first transistor and a second transistor of the second pair of transistors.

5. The circuit of claim 1 wherein the first pair of transistors comprises a first transistor type different from a second transistor type of the second pair of transistors.

6. The circuit of claim 5 wherein the first pair of switches and the second pair of switches comprise transistors of the second transistor type.

7. The circuit of claim 1 wherein the first IO and the second IO operate in conjunction with bit lines associated with a memory array.

8. The circuit of claim 7 wherein the first IO and the second IO further operate in conjunction with global bit lines associated with the memory array.

9. The circuit of claim 1 further comprising a first equalization circuit to equalize the first IO and the second IO to a voltage reference before compensation of the second pair of transistors.

10. The circuit of claim 9 further comprising a second equalization circuit to turn off the circuit before compensation of the second pair of transistors.

11. The circuit of claim 9 further comprising a third pair of transistors to allow a weak transition of an operation signal during compensation.

* * * * *